(12) United States Patent  
Kim

(10) Patent No.: US 9,761,330 B1  
(45) Date of Patent: Sep. 12, 2017

(54) SEMICONDUCTOR DEVICE

(71) Applicant: SK hynix Inc., Icheon-si, Gyeonggi-do (KR)

(72) Inventor: Jae Il Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/271,734

(22) Filed: Sep. 21, 2016

(30) Foreign Application Priority Data

May 13, 2016 (KR) .................. 10-2016-0058856

(51) Int. Cl.
| | |
|---|---|
| G11C 29/26 | (2006.01) |
| G11C 29/00 | (2006.01) |
| G11C 11/406 | (2006.01) |
| G11C 11/4091 | (2006.01) |
| G11C 11/4076 | (2006.01) |
| G11C 11/408 | (2006.01) |

(52) U.S. Cl.
CPC .......... *G11C 29/76* (2013.01); *G11C 11/4076* (2013.01); *G11C 11/4085* (2013.01); *G11C 11/4091* (2013.01); *G11C 11/40615* (2013.01)

(58) Field of Classification Search
CPC .................. G11C 29/26; G11C 11/40615
USPC .................................... 365/189.05
See application file for complete search history.

(56) References Cited

U.S. PATENT DOCUMENTS

| 7,224,596 | B2 | 5/2007 | Jeong et al. | |
|---|---|---|---|---|
| 7,602,661 | B2 * | 10/2009 | Kim ...................... | G11C 29/783 |
| | | | | 365/191 |
| 8,634,262 | B2 | 1/2014 | Lee | |
| 9,123,389 | B1 * | 9/2015 | Park ...................... | G11C 11/406 |
| 2002/0054521 | A1 * | 5/2002 | Sato ...................... | G11C 7/20 |
| | | | | 365/200 |
| 2003/0123301 | A1 * | 7/2003 | Jang et al. ........... | G11C 29/785 |
| | | | | 365/200 |
| 2008/0002507 | A1 * | 1/2008 | Lee ...................... | G11C 8/08 |
| | | | | 365/230.03 |
| 2010/0110810 | A1 * | 5/2010 | Kobayashi ............ | G11C 11/406 |
| | | | | 365/200 |

* cited by examiner

*Primary Examiner* — Hoai V Ho  
*Assistant Examiner* — Muna A Techane  
(74) *Attorney, Agent, or Firm* — William Park & Associates Ltd.

(57) ABSTRACT

A semiconductor device may include a refresh counter configured to output a plurality of refresh addresses by counting a refresh signal; a check signal generator configured to generate a check signal according to a logic level of any one specific refresh address among the plurality of refresh addresses during a refresh operation, and output the check signal in response to a redundancy check pulse signal; a redundancy checker configured to store information on whether a redundancy cell was used, in response to the check signal, the redundancy check pulse signal and the plurality of refresh addresses, and output a word line control signal according to whether the redundancy cell was used; and a refresh controller configured to control a row address for selectively enabling a word line and a redundancy word line of a cell array in response to the word line control signal.

18 Claims, 10 Drawing Sheets

SEMICONDUCTOR DEVICE

CROSS-REFERENCES TO RELATED APPLICATION

The present application claims priority under 35 U.S.C. §119(a) to Korean application number 10-2016-0058856, filed on May 13, 2016, in the Korean Intellectual Property Office, which is incorporated herein by reference in its entirety.

BACKGROUND

1. Technical Field

Various embodiments relate to a semiconductor device, and more particularly, to a technology capable of preventing a malfunction during a refresh operation.

2. Related Art

Recently, more and more mobile electronic devices including smart phones need large-capacity DRAM. In general, data stored in a memory cell of a semiconductor memory device such as DRAM may be changed by leakage current. Thus, a refresh operation is required to periodically recharge the memory cell having data stored therein.

That is, a memory cell of a dynamic semiconductor memory such as DRAM, stores data in a capacitive element. Due to charge leakage from the capacitive element, the memory cell must be periodically refreshed. The refresh process typically includes a step of performing a read operation to acquire a charge level in the original state, the charge level being stored in the memory cell.

In particular, a semiconductor memory device including DDR SDRAM (Double Data Rate Synchronous DRAM) includes a plurality of memory banks for storing data, and each of the memory banks includes tens of millions of memory cells. Each of the memory cells includes a cell capacitor and a cell transistor, and the semiconductor memory device stores data through an operation of charging or discharging the cell capacitor.

Ideally, an electrical charge stored in the capacitor must always be constant when no specific control operation is performed. In reality, however, the electrical charge stored in the cell capacitor is changed due to a voltage difference from a surrounding circuit.

That is, electrical charge may leak in a state when the cell capacitor is charged, or electrical charge may be introduced in a state when the cell capacitor is discharged. When the electrical charge of the cell capacitor is changed, the cell capacitor may indicate that data stored in the cell capacitor is changed or lost. In order to prevent such a data loss, the semiconductor memory device performs a refresh operation.

Various types of refresh methods have been developed. According to an auto refresh method, a refresh timer exists outside a memory chip, and the memory chip performs a refresh operation in response to a periodic refresh command supplied by a controller.

According to a self refresh method, a refresh timer exists in a memory chip, and all memory chips request a refresh start command from a controller.

SUMMARY

Various embodiments are directed to a semiconductor device capable of preventing a malfunction which is caused according to whether a redundancy cell was used during a refresh operation.

In an embodiment of the present disclosure, a semiconductor device may include: a refresh counter configured to output a plurality of refresh addresses by counting a refresh signal; a check signal generator configured to generate a check signal according to a logic level of any one specific refresh address among the plurality of refresh addresses during a refresh operation, and output the check signal in response to a redundancy check pulse signal; a redundancy checker configured to store information on whether a redundancy cell was used, in response to the check signal, the redundancy check pulse signal and the plurality of refresh addresses, and output a word line control signal according to whether the redundancy cell was used; and a refresh controller configured to control a row address for selectively enabling a word line and a redundancy word line of a cell array in response to the word line control signal.

In an embodiment of the present disclosure, a semiconductor device may include: a cell array which includes upper and lower regions divided on a word line basis, and in which a refresh operation is performed in response to enablement of a word line and a redundancy word line; a check signal generator configured to generate a check signal corresponding to a logic level of any one specific refresh address among a plurality of refresh addresses during a refresh operation, and output the check signal in response to a redundancy check pulse signal; a redundancy checker configured to store information on whether a redundancy cell was used, in response to the check signal, the redundancy check pulse signal and the plurality of addresses, and output a word line control signal according to whether the redundancy cell was used; and a refresh controller configured to control a row address for selectively enabling the word line and the redundancy word line in response to the word line control signal.

BRIEF DESCRIPTION OF THE DRAWINGS

Features, aspects, and embodiments are described in conjunction with the attached drawings, in which.

DETAILED DESCRIPTION

Hereinafter, a semiconductor device according to the present disclosure will be described below with reference to the accompanying drawings through exemplary embodiments.

Figure 1:
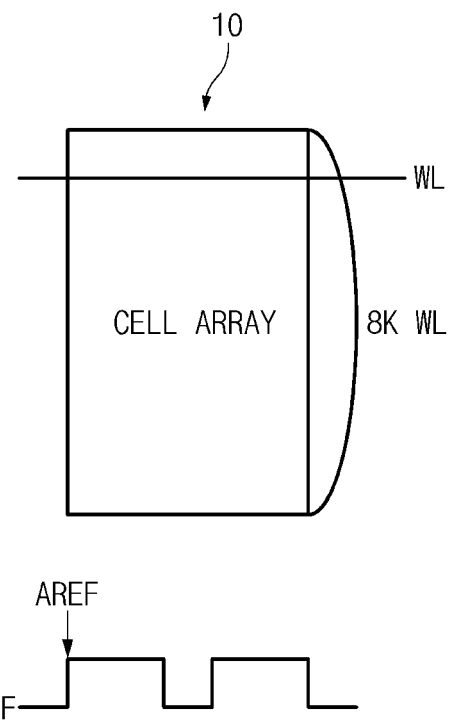
FIGS. 1 and 2 are diagrams for describing a refresh operation of a semiconductor device.
Figure 2:
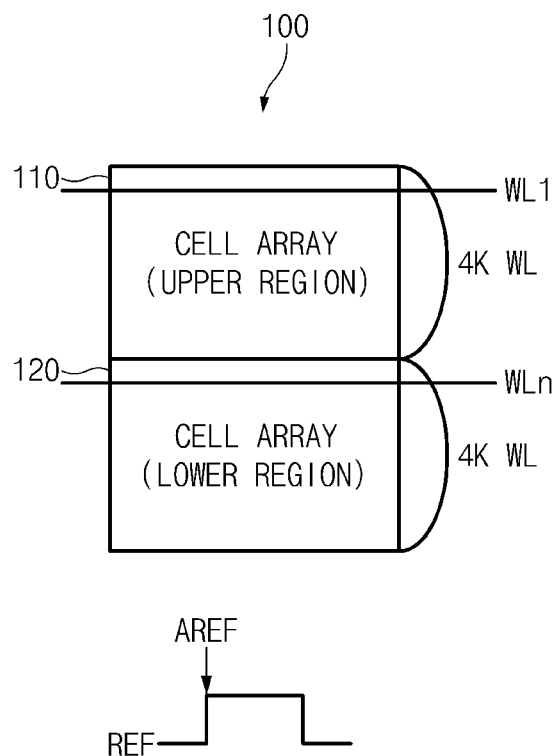

FIGS. 1 and 2 are diagrams for describing a refresh operation of a memory device.

In the case of a memory cell including one transistor and one capacitor, data may be stored in the capacitor. However, as the size of the capacitor is reduced to increase integration density, the capacitor may be discharged faster, which makes it difficult to retain the data for a long time.

Therefore, in order to retain data stored in the memory cell for a long time, a refresh operation may be performed to restore the data stored in the memory cell at predetermined time intervals.

For example, as illustrated in FIG. 1, 8K (8182) word lines WL in a cell array 10 may be refreshed at every 64 ms. Thus, a refresh cycle tREFI indicating an average refresh interval may be set to approximately 7.8 us, and a data retention time of 64 ms needs to be given to one memory cell.

FIG. 1 illustrates a case in which one word line WL of 8K word lines is enabled during one refresh operation. Furthermore, FIG. 1 illustrates a case in which two refresh operations are successively performed in response to a refresh signal AREF when one refresh command REF is applied.

The semiconductor memory device needs to periodically perform a refresh operation due to a leakage component of a memory cell. For example, the semiconductor memory device may perform 8K refresh operations for 64 ms.

Externally, the refresh operation is performed according to a preset specification. However, as technology of the semiconductor device shrinks, a leakage component of a memory cell gradually increases. That is, while the semiconductor device is scaled down, the data retention time of a memory cell is not maintained at 64 ms. Furthermore, since two refresh operations are performed in response to one refresh command, it is difficult to perform the refresh operations within a given refresh cycle tRFC.

Thus, as illustrated in FIG. 2, a multi-word line refresh method may be used to refresh a plurality of word lines in response to one refresh command. In this case, when one refresh command REF is applied, one refresh operation may be performed in response to a refresh signal AREF.

For example, during one refresh operation, a plurality of word lines WL1 and WLn per 8K word lines may be enabled in the cell array 100. In the embodiment of FIG. 2, the cell array 100 may be divided into an upper region 110 and a lower region 120. Furthermore, the case in which one word line WL1 per 4K word lines is enabled in the upper region 110 and one work line WLn per 4K word lines is enabled in the lower region 120, during the refresh operation, will be taken as an example for description.

Figure 3:
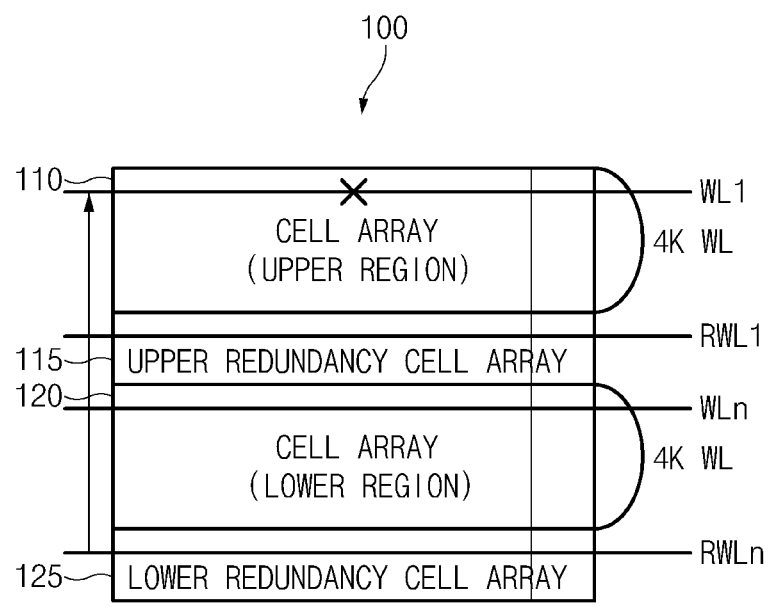
FIG. 3 is a diagram for describing a malfunction according to whether redundancy cells were used during a refresh operation of the semiconductor device.

FIG. 3 is a diagram for describing a malfunction according to whether redundancy cells were used during a refresh operation of the semiconductor device.

The cell array 100 of the semiconductor device may include the upper region 110, the lower region 120, an upper redundancy cell array 115, and a lower redundancy cell array 125.

The upper redundancy cell array 115 may be used to replace a defective cell on a row/column basis, when the defective cell occurs in the upper region 110. When a defect occurs in the upper region 110 during a repair operation, the word line WL1 of the upper region 110 may be replaced with a redundancy word line RWL1 of the upper redundancy cell array 115.

The lower redundancy cell array 125 may be used to replace a defective cell on a row/column basis, when the defective cell occurs in the lower region 120. When a defect occurs in the lower region 120 during a repair operation, the word line WLn of the lower region 120 associated with the defect may be replaced with a redundancy word line RWLn.

However, when the multi-word line refresh operation is performed on an any-to-any basis, a refresh operation may be performed on 8K word lines WL1, . . . , WLn, . . . in the cell array 100 regardless of whether redundancy cells were used.

According to the any-to-any basis, when a defective cell occurs in the upper region 110, the defective cell can be repaired through any one of the upper redundancy cell array 115 and the lower redundancy cell array 125. Similarly, when a defective cell occurs in the lower region 120, the defective cell can be repaired through any one of the upper redundancy cell array 115 and the lower redundancy cell array 125.

For example, during a multi-word line refresh operation, a word line WL1 of the upper region 110 and a word line WLn of the lower region 120 may be enabled at the same time. At this time, suppose that a defect occurs in any one word line WL1 of the 4K word lines included in the upper region 110. When a defective cell occurs in the upper region 110, the defective cell may be replaced with a redundancy cell of the lower redundancy cell array 125 of the lower region 120.

However, when redundancy cells of the lower redundancy cell array 125 are already in use, the defective cell of the upper region 110 may not be normally replaced which causes a malfunction. Thus, there is a demand for a technology for preventing a malfunction which is caused by the use of redundancy cells when multiple word lines are enabled during a refresh operation.

Figure 4:
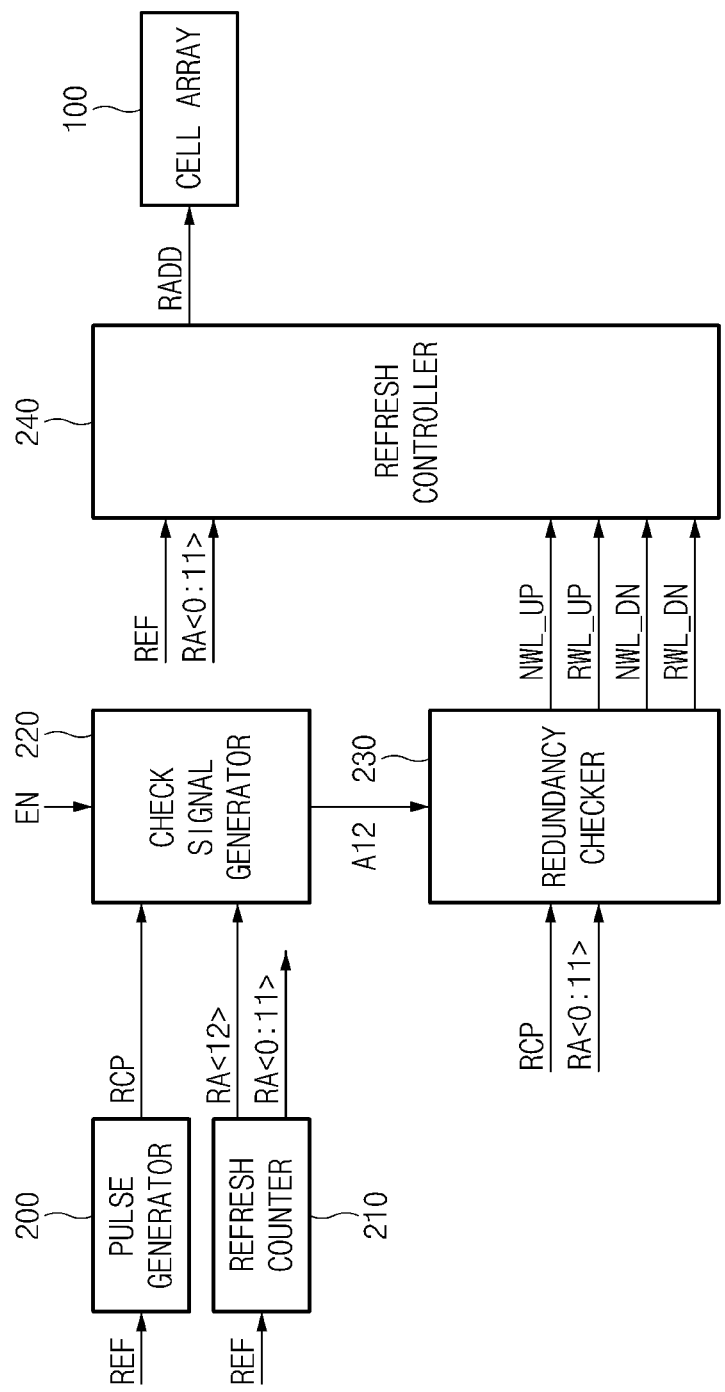
FIG. 4 is a configuration diagram of a semiconductor device according to an embodiment.

FIG. 4 is a configuration diagram of a semiconductor device according to an embodiment.

The semiconductor device according to the present embodiment may include a pulse generator 200, a refresh counter 210, a check signal generator 220, a redundancy checker 230, a refresh controller 240, and a cell array 100.

The pulse generator 200 may generate a redundancy check pulse signal RCP for checking whether a redundancy cell corresponding to an address of the cell array 100 was used in response to a refresh signal REF. The cell array 100 may include an upper region 110 and a lower region 120 which may be divided on a word line basis.

The refresh counter 210 may count a refresh signal REF and output a plurality of refresh addresses RA<0:12>. The refresh counter 210 may sequentially count the refresh addresses RA<0:12> for accessing a cell in which a refresh operation is performed whenever a refresh command is generated.

For example, the refresh counter 210 may sequentially output the refresh addresses RA<0:12> by counting how many times the refresh signal REF transitions to a high-level pulse signal. Thus, a refresh operation may be performed on the cell array 100 accessed by the refresh addresses RA<0:12>.

The refresh addresses RA<0:11> of the refresh addresses RA<0:12> generated by the refresh counter 210 may be outputted to the redundancy checker 230 and the refresh controller 240, in order to select a word line to be refreshed. The refresh address RA<12> of the refresh addresses RA<0:12> generated by the refresh counter 210 may be outputted to the check signal generator 220. The refresh address RA<12> is a signal for selecting the upper region 110 or the lower region 120 of the cell array 100 during a refresh operation.

In the present embodiment, the case in which the number of the refresh addresses RA<0:12> outputted from the refresh counter 210 is set to 13 has been described. However, the number of addresses is not limited thereto, but can be set to various other values.

The check signal generator 220 may generate a check signal A12 for checking whether redundancy cells were used, in response to at least one of a redundancy check pulse signal RCP and the refresh address RA<12> during a refresh operation, when an enable signal EN is activated. The check signal generator 220 may generate the check signal A12 only when the enable signal EN is activated, and recognize the state of the refresh address RA<12> as a don't-care state when the enable signal EN is deactivated.

The redundancy checker 230 may store information on whether a corresponding cell of the cell array 100 was used as a redundancy cell in response to the redundancy check pulse signal RCP, the refresh addresses RA<0:11>, and the check signal A12.

The redundancy checker 230 may output one or more word line control signals such as an upper word line control signal NWL_UP, an upper redundancy word line control signal RWL_UP, a lower word line control signal NWL_DN, and a lower redundancy word line control signal RWL_DN to the refresh controller 240, in order to control the respective word lines of the cell array 100 in response to whether redundancy cells were used.

The upper word line control signal NWL_UP is a control signal for selectively enabling a word line of the upper region 110 of the cell array 100, for example, the word line WL1. The redundancy word line control signal RWL_UP is a control signal for selectively enabling a redundancy word line of the upper redundancy cell array 115 of the cell array 100, for example, the redundancy word line RWL1.

The lower word line control signal NWL_DN is a control signal for selectively enabling a word line of the lower region 120 of the cell array 100, for example, the word line WLn. The lower redundancy word line control signal RWL_DN is a control signal for selectively enabling a redundancy word line of the lower redundancy cell array 125 of the cell array 100, for example, the redundancy word line RWLn.

The refresh controller 240 may output a row address RADD for controlling a refresh operation to the cell array 100. The refresh controller 240 may output the row address RADD in response to the refresh signal REF, the refresh addresses RA<0:11>, the upper word line control signal NWL_UP, the upper redundancy word line control signal RWL_UP, the lower word line control signal NWL_DN, and the lower redundancy word line control signal RWL_DN.

The cell array 100 may include a plurality of unit cells in row and column directions. The cell array 100 may include a plurality of unit cells, and perform a refresh operation for a memory cell according to an output of the refresh controller 240.

In the cell array 100, multiple word lines and redundancy word lines corresponding to the row address RADD may be enabled to perform a refresh operation. The row address RADD may indicate the address information of a row line in which a refresh operation is to be performed, that is, a word line.

The refresh operation may be performed by sensing and amplifying data of the respective cells in the cell array within data retention times of the respective cells. The data retention time refers to the time during which any data can be retained without a refresh operation, after the data is written to a cell.

The refresh mode may include an auto refresh mode in which a RAS command /RAS and a CAS command /CAS are periodically provided during a normal operation and an address is internally generated to perform a refresh operation. The refresh mode may also include a self refresh mode in which a clock enable signal cke is enabled and a command is internally generated to perform a refresh operation. Both the auto refresh mode and the self refresh mode may be performed according to an address generated through the refresh counter 210 after a command is received. The address may sequentially increase whenever a request is inputted.

Figure 5:
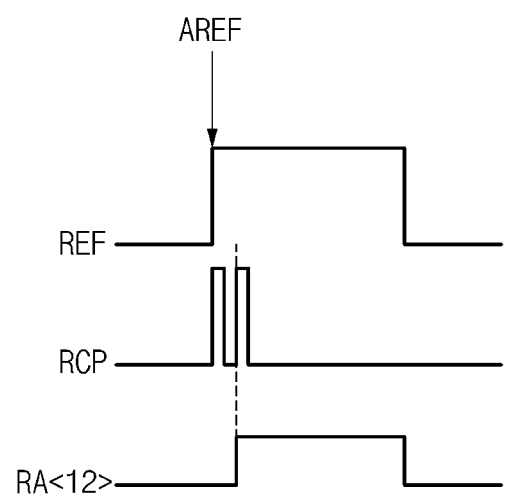
FIG. 5 is a diagram for describing an operation of a check signal generator of FIG. 4.

FIG. 5 is a diagram for describing the operation of the check signal generator 220 of FIG. 4.

If an auto refresh command signal AREF is applied when the refresh signal REF is activated, the pulse generator 200 may consecutively generate two redundancy check pulse signals RCP. The refresh counter 210 may output the refresh address RA<12> at a low level, and then change the refresh address RA<12> to a high level.

The check signal generator 220 may receive the refresh address RA<12> with a low level when the first redundancy check pulse signal RCP is activated. That is, the check signal generator 220 may output the check signal A12 at a low level when the refresh address RA<12> is at a low level.

The check signal generator 220 may receive the refresh address RA<12> with a high level when the second redundancy check pulse signal RCP is activated. That is, the check signal generator 220 may output the check signal A12 at a high level when the refresh address RA<12> is at a high level.

As such, the check signal generator 220 may output the check signal A12 at a low level in response to the high-level period of the first redundancy check pulse signal RCP, and output the check signal A12 at a high level in response to the high-level period of the second redundancy check pulse signal RCP.

Figure 6:
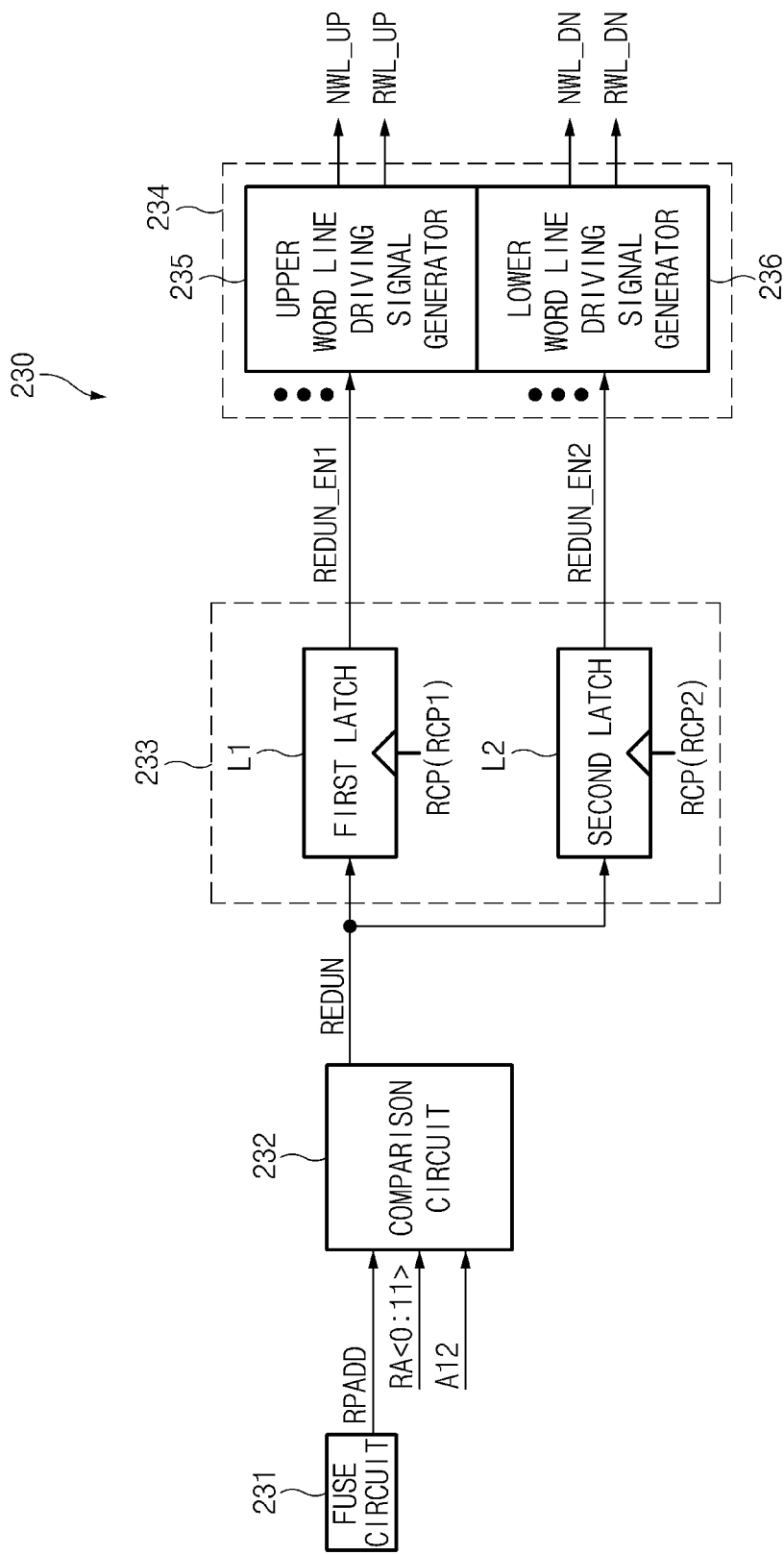
FIG. 6 is a detailed configuration diagram of a redundancy checker of FIG. 4.

FIG. 6 is a detailed configuration diagram of the redundancy checker 230 of FIG. 4.

The redundancy checker 230 may include a fuse circuit 231, a comparison circuit 232, a latch circuit 233, and a word line control circuit 234.

The fuse circuit 231 may include a plurality of fuses. The fuse circuit 231 may store repair information on the respective cells of the cell array 100, and output a repair address RPADD corresponding to the repair information to the comparison circuit 232.

The fuse circuit 231 may have previously stored fuse data corresponding to characteristic information of the cell array 100 according to whether the fuses have been cut. For example, the fuse circuit 231 may store information on repaired cells corresponding to the respective cells of the cell array 100. The fuse circuit 231 may include an ARE (Array E-fuse) in which unit fuse cells are arranged in row and column directions.

The semiconductor device (for example, DRAM (Dynamic Random Access Memory)) may include a plurality of memory cells arranged in a matrix shape. However, when a defect occurs in any one of the memory cells, the semiconductor device may be discarded because the semiconductor device cannot perform an operation normally. Furthermore, improvement in the integration density and operating speed of the semiconductor device may raise the possibility that a defective cell will occur.

Therefore, the yield of DRAMs may be lowered, the yield of a DRAM being represented by a ratio of the number of normal chips to the total number of chips and determining the fabrication cost of the DRAM. Thus, research has been conducted on a method for efficiently repairing defective cells in order to improve the yield while increasing the integration density and operating speed of the semiconductor device.

Examples of methods for repairing a defective cell may include a technology using a repair circuit which replaces a defective cell with a redundancy cell. The repair circuit may include redundancy columns/rows arranged in columns and rows each including a plurality of redundancy memory cells. The repair circuit may select a redundancy column/row instead of a column/row in which a defect occurred.

That is, when a row and/or column address signal designating a defective cell is inputted, a redundancy column/row may be selected instead of a defective column/row of a normal memory cell bank.

In order to recognize an address designating a defective cell, a plurality of cuttable fuses may be provided. The plurality of fuses may be selectively cut to program the address of the defective cell.

The comparison circuit 232 may compare the repair address RPADD to the refresh addresses RA<0:11> and the check signal A12, and output a redundancy signal REDUN indicating whether a redundancy cell was used. That is, the comparison circuit 232 may compare the repair address RPADD to the refresh addresses RA<0:11> in response to the logic level of the check signal A12, and output the redundancy signal REDUN.

For example, the comparison circuit 232 may compare the repair address RPADD to the refresh addresses RA<0:11> when the check signal A12 is at a low level, and output the redundancy signal REDUN having a low level. On the other hand, the comparison circuit 232 may compare the repair address RPADD to the refresh addresses RA<0:11> when the check signal A12 is at a high level, and output the redundancy signal REDUN having a high level.

That is, the comparison circuit 232 may compare the refresh addresses RA<0:11> to the repair address RPADD when the check signal A12 is at a low level, and check whether the redundancy cell array 115 of the upper region 110 was used. Or, the comparison circuit 232 may compare the refresh addresses RA<0:11> to the repair address RPADD when the check signal A12 is at a high level, and check whether the lower redundancy cell array 125 of the lower region 120 was used.

The latch circuit 233 may latch the redundancy signal REDUN indicating whether a redundancy cell was used, in response to the redundancy check pulse signal RCP. The latch circuit 233 may include a first latch L1 and a second latch L2. A first enabled pulse signal of the redundancy check pulse signal RCP may be referred to as a first redundancy check pulse signal RCP1, and a second enabled pulse signal of the redundancy check pulse signal RCP may be referred to as a second redundancy check pulse signal RCP2.

The first latch L1 may latch the redundancy signal REDUN in response to the first redundancy check pulse signal RCP1 and output a redundancy enable signal REDUN_EN1, during a period in which the first redundancy check pulse signal RCP1 is enabled. That is, the first latch L1 may output the redundancy enable signal REDUN_EN1 when the check signal A12 is at a low level. For example, when the upper redundancy cell array 115 was used, the first latch L1 may output the redundancy enable signal REDUN_EN1 at a high level.

The second latch L2 may latch the redundancy signal REDUN in response to the second redundancy check pulse signal RCP2 and output a redundancy enable signal REDUN_EN2, during a period in which the second redundancy check pulse signal RCP2 is enabled. That is, the second latch L2 may output the redundancy enable signal REDUN_EN2 when the check signal A12 is at a high level. For example, when the lower redundancy cell array 125 was used, the second latch L2 may output the redundancy enable signal REDUN_EN2 at a high level.

The word line control circuit 234 may output the upper word line control signal NWL_UP, the upper redundancy word line control signal RWL_UP, the lower word line control signal NWL_DN, and the lower redundancy word line control signal RWL_DN, in order to control the respective word lines of the cell array 100 according to whether redundancy cells were used, in response to the redundancy enable signals REDUN_EN1 and REDUN_EN2.

The word line control circuit 234 may include an upper word line driving signal generator 235 and a lower word line driving signal generator 236.

The upper word line driving signal generator 235 may control the upper word line control signal NWL_UP for controlling the upper region 110 of the cell array 100 and control the upper redundancy word line control signal RWL_UP for controlling the upper redundancy cell array 115, in response to the redundancy enable signal REDUN_EN1. For example, the upper word line driving signal generator 235 may disable the upper word line control signal NWL_UP when the redundancy enable signal REDUN_EN1 is activated at a high level.

The lower word line driving signal generator 236 may control the lower word line control signal NWL_DN for controlling the lower region 120 of the cell array 100 and control the lower redundancy word line control signal RWL_DN for controlling the lower redundancy cell array 125, in response to the redundancy enable signal REDUN_EN2. For example, the lower word line driving signal generator 236 may disable the lower word line control signal NWL_DN when the redundancy enable signal REDUN_EN2 is activated at a high level.

Figure 7:
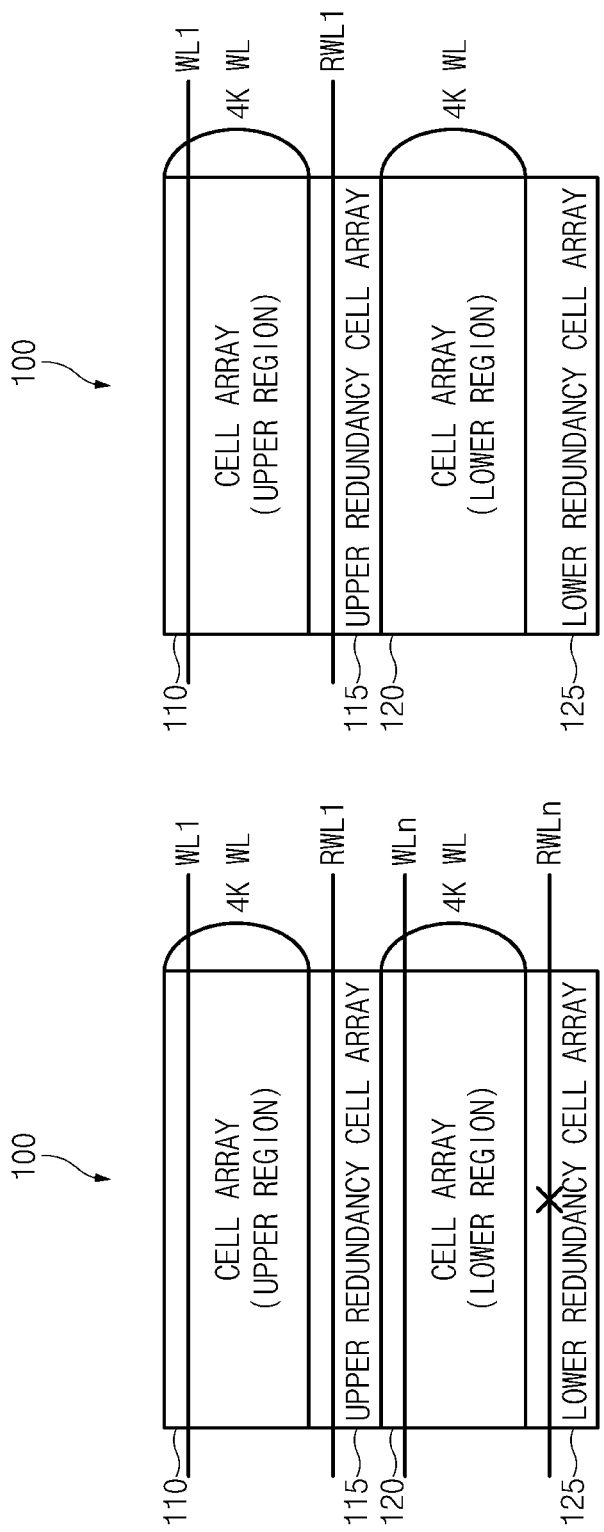
FIG. 7 is a diagram for describing a word line enable operation of a cell array of FIG. 4.

FIG. 7 is a diagram for describing the word line enable operation of the cell array 100 of FIG. 4.

When any one of a number of cells has a defect, a memory may not be considered normal memory, but discarded as a defective product. However, when all the memory cells are discarded as a defective product even though a defective cell is very likely to occur according to an increase in the integration density of the memory, it is inefficient in terms of yield.

Thus, the cell array 100 may include redundancy memory cells. When a defective cell occurs, the defective cell may be replaced with a redundancy memory cell in order to improve the yield. The semiconductor device may include the upper and lower regions 110 and 120 including the plurality of normal word lines WL1 to WLn for storing data and the semiconductor device may also include upper and lower redundancy cell arrays 115 and 125 including the plurality of redundancy word lines RWL1 to RWLN for replacing a defective normal word line of a normal memory block.

The upper region 110 of the cell array 100 may be refreshed by the word line WL1 and the redundancy word line RWL1. The lower region 120 of the cell array 100 may be refreshed by the word line WLn and the redundancy word line RWLn.

The redundancy checker 230 may determine whether redundancy cells were used in the upper region 110 and the lower region 120 of the cell array 100. Thus, the refresh controller 240 may control the row address RADD to selectively enable or disable the word lines WL1 to WLn and the redundancy word lines RWL1 to RWLn of the cell array 100 in response to the word line control signal. In one embodiment, the refresh controller 240 may disable a word line WL1 of the upper region 110 when the redundancy enable signal REDUN_EN1 is activated, and disable a word line WLn of the lower region 120 when the redundancy enable signal REDUN_EN2 is activated.

For example, suppose that the word line WL1 of the upper region 110 and the word line WLn of the lower region 120 in the cell array 100 are enabled during a refresh operation. When the redundancy enable signal REDUN_EN2 is enabled or activated, the redundancy checker 230 may determine whether a redundancy cell of the lower region 120 was used. Then, only the word line WL1 of the upper region 110 may be enabled, and the word line WLn for refreshing the lower region 120 may be disabled by the refresh controller 240.

Figure 8:
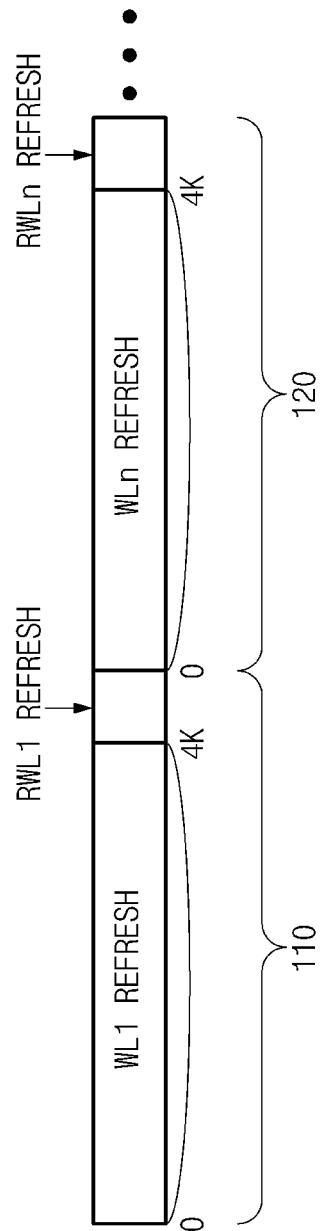
FIG. 8 is a diagram for describing refresh operations for a word line and a redundancy word line in the cell array of FIG. 4.

FIG. 8 is a diagram for describing refresh operations for a word line and a redundancy word line in the cell array 100 of FIG. 4.

In the present embodiment, when the lower redundancy cell array 125 was used as illustrated in FIG. 7, the word line WL1 of the upper region 110 may be first refreshed. After the refresh operation of the upper region 110 has ended, the redundancy word line RWL1 of the upper redundancy cell array 115 may be refreshed during a separate period.

On the other hand, when the upper redundancy cell array 115 is used, the word line WLn of the lower region 120 may be refreshed first. After the refresh operation of the lower region 120 has ended, the redundancy word line RWLn of the lower redundancy cell array 125 may be refreshed during a separate period.

Figure 9:
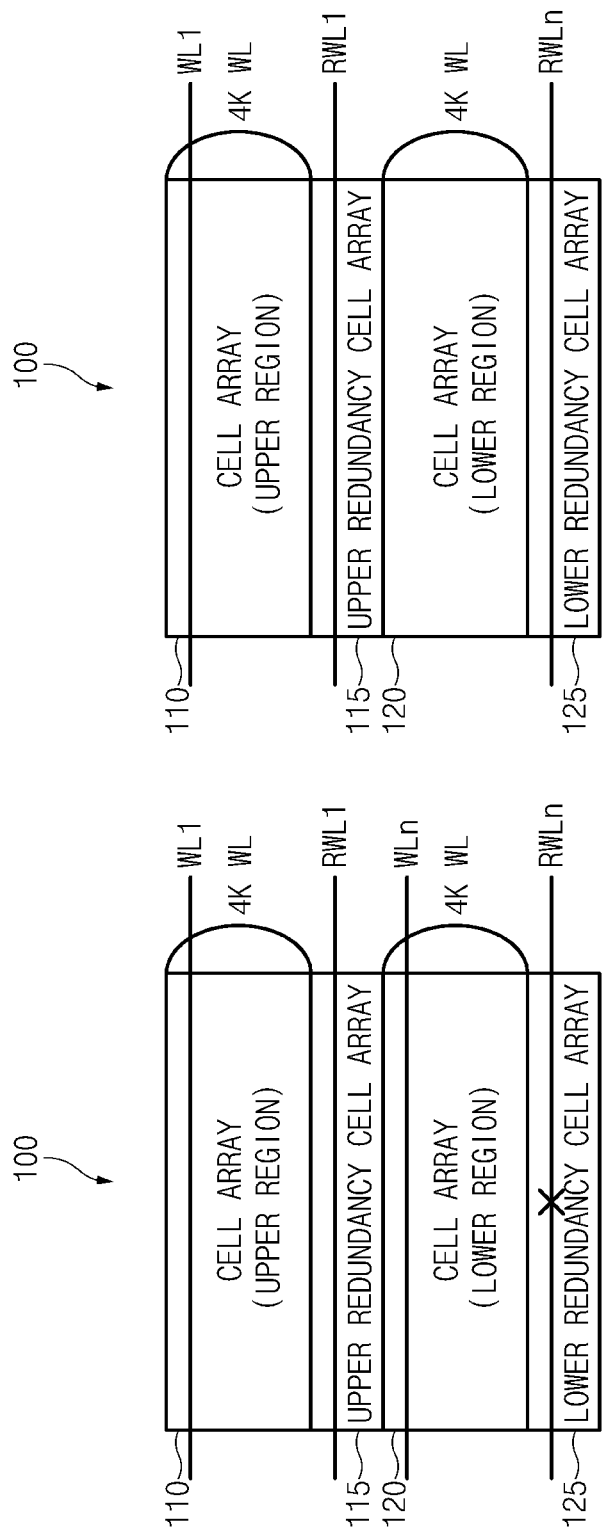
FIG. 9 is a diagram for describing another embodiment of a word line enable operation of the cell array in FIG. 4.

FIG. 9 is a diagram for describing another embodiment of the word line enable operation of the cell array 100 in FIG. 4.

The word line WL1 and the redundancy word line RWL1 may perform a refresh operation in the upper region 110 of the cell array 100. The redundancy checker 230 may determine whether redundancy cells were used in the upper region 110 and the lower region 120 of the cell array 100. Thus, the refresh controller 240 may selectively enable or disable a word line and a redundancy word line of the cell array 100 according to the row address RADD.

For example, suppose that the word line WL1 of the upper region 110 and the word line WLn of the lower region 120 in the cell array 100 are enabled during a refresh operation. When the redundancy enable signal REDUN_EN2 is enabled, the redundancy checker 230 may determine whether a redundancy cell of the lower region 120 was used.

Then, only the word line WL1 of the upper region 110 may be enabled, and the word line WLn for refreshing the lower region 120 may be disabled. While the upper region 110 performs the refresh operation, the redundancy word line RWLn of the lower redundancy cell array 125 may be sequentially refreshed. Thus, when only the upper region 110 is refreshed during a multi-word line refresh operation period, this period may be used as a period for refreshing the lower redundancy cell array 125.

In the present embodiment, it has been described that the self refresh unit of the semiconductor device was set to 4K. However, the present embodiment is not limited thereto, but the self refresh unit of the semiconductor device may be set to another unit greater or less than the 4 k size.

According to the present embodiments, the semiconductor device can prevent a malfunction which is caused by using redundancy cells during a refresh operation.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

Figure 10:
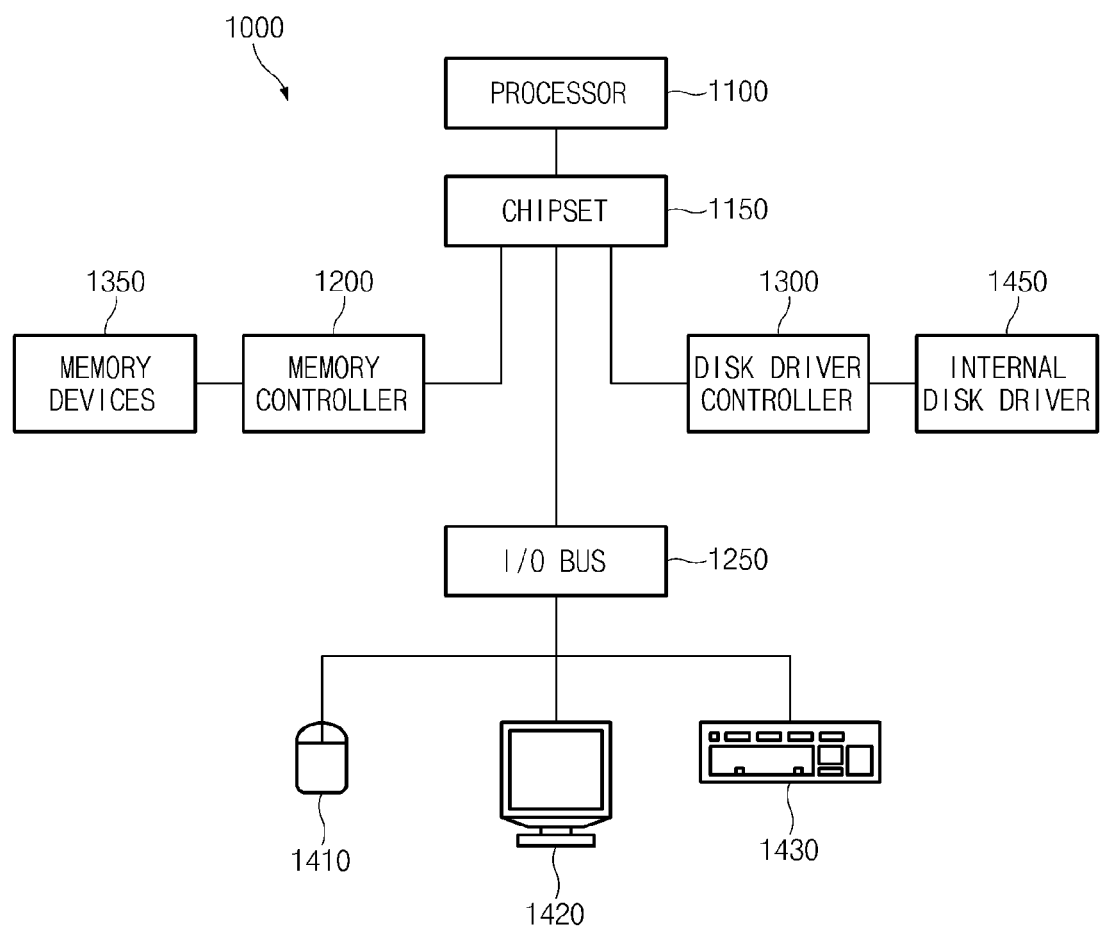
FIG. 10 illustrates a block diagram of an example system employing a semiconductor device in accordance with the various embodiments discussed above with relation to FIGS. 1-9.

The semiconductor devices discussed above (see FIGS. 1-9) are particularly useful in the design of memory devices, processors, and computer systems. For example, referring to FIG. 10, a block diagram of a system employing a semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device discussed above with reference to FIGS. 1-9. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-9, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 10 is merely one example of a system 1000 employing a semiconductor device as discussed above with relation to FIGS. 1-9. In alternate embodiments, such as, for example but not limited to, cellular phones or digital cameras, the components may differ from the embodiments illustrated in FIG. 10.

What is claimed is:

1. A semiconductor device comprising:
a refresh counter configured to output a plurality of refresh addresses by counting a refresh signal;
a check signal generator configured to generate a check signal according to a logic level of any one specific refresh address among the plurality of refresh addresses during a refresh operation, and output the check signal in response to a redundancy check pulse signal;
a redundancy checker configured to store information on whether a redundancy cell was used, in response to the check signal, the redundancy check pulse signal and the plurality of refresh addresses, and output a word line control signal according to whether the redundancy cell was used; and
a refresh controller configured to control a row address for selectively enabling a word line and a redundancy word line of a cell array in response to the word line control signal,
wherein the redundancy checker comprises:
a word line control circuit configured to output the word line control signal in response to a redundancy enable signal,
wherein the word line control circuit comprises:
an upper word line driving signal generator configured to control an upper word line control signal and control an upper redundancy word line control signal, when a first redundancy enable signal of the redundancy enable signal is activated; and
a lower word line driving signal generator configured to control a lower word line control signal and a lower redundancy word line control signal, when a second redundancy enable signal of the redundancy enable signal is activated,
wherein the first redundancy enable signal and the second redundancy enable signal are consecutively activated at predetermined time intervals during a multi-word line refresh operation period.

2. The semiconductor device of claim 1, further comprising a pulse generator configured to generate the redundancy check pulse signal.

3. The semiconductor device of claim 2, wherein the pulse generator consecutively generates two pulse signals when the refresh signal is activated.

4. The semiconductor device of claim 1, wherein the check signal generator outputs the check signal at a low level in response to a first pulse signal of the redundancy check pulse signal, and outputs the check signal at a high level in response to a second pulse signal of the redundancy check pulse signal.

5. The semiconductor device of claim 1, wherein the redundancy checker further comprises:
a fuse circuit configured to store a repair address of the cell array;
a comparison circuit configured to compare the repair address to the plurality of refresh addresses, and output the redundancy signal indicating whether the redundancy cell was used; and
a latch circuit configured to latch the redundancy signal and output the redundancy enable signal, in response to the redundancy check pulse signal.

6. The semiconductor device of claim 5, wherein the comparison circuit compares the refresh address to the repair address when the check signal is at a low level, or compares the refresh addresses to the repair address when the check signal is at a high level.

7. The semiconductor device of claim 5, wherein the latch circuit comprises:
a first latch configured to latch the redundancy signal in response to a first pulse signal of the redundancy check pulse signal, and output the first redundancy enable signal; and
a second latch configured to latch the redundancy signal in response to a second pulse signal of the redundancy check pulse signal, and output the second redundancy enable signal.

8. The semiconductor device of claim 1, wherein the word line control circuit disables the upper word line control signal when the first redundancy enable signal is activated.

9. The semiconductor device of claim 1, wherein the word line control circuit disables the lower word line control signal when the second redundancy enable signal is activated.

10. A semiconductor device comprising:
a cell array which comprises upper and lower regions divided on a word line basis, and in which a refresh operation is performed in response to enablement of a word line and a redundancy word line;
a check signal generator configured to generate a check signal corresponding to a logic level of any one specific refresh address among a plurality of refresh addresses during a refresh operation, and output the check signal in response to a redundancy check pulse signal;
a redundancy checker configured to store information on whether a redundancy cell was used, in response to the check signal, the redundancy check pulse signal and the plurality of addresses, and output a word line control signal according to whether the redundancy cell was used; and
a refresh controller configured to control a row address for selectively enabling the word line and the redundancy word line in response to the word line control signal,
wherein the redundancy checker comprises
a word line control circuit configured to output the word line control signal in response to a redundancy enable signal,
wherein the word line control circuit comprises:
an upper word line driving signal generator configured to control an upper word line control signal and control an upper redundancy word line control signal of the upper region, when a first redundancy enable signal of the redundancy enable signal is activated; and
a lower word line driving signal generator configured to control a lower word line control signal and a lower redundancy word line control signal of the lower region, when a second redundancy enable signal of the redundancy enable signal is activated, wherein the first redundancy enable signal and the second redundancy enable signal are consecutively activated at predetermined time intervals during a multi-word line refresh operation period.

11. The semiconductor device of claim 10, further comprising a refresh counter configured to output the plurality of refresh addresses by counting the refresh signal.

12. The semiconductor device of claim 10, further comprising a pulse generator configured to generate the redundancy check pulse signal.

13. The semiconductor device of claim 12, wherein the pulse generator consecutively generates two pulse signals when the refresh signal is activated.

14. The semiconductor device of claim 10, wherein the check signal generator outputs the check signal at a low level in response to a first pulse signal of the redundancy check pulse signal, and outputs the check signal at a high level in response to a second pulse signal of the redundancy check pulse signal.

15. The semiconductor device of claim 10, wherein the redundancy checker further comprises:
- a fuse circuit configured to store a repair address of the cell array;
- a comparison circuit configured to compare the repair address to the plurality of refresh addresses, and output the redundancy signal indicating whether the redundancy cell was used; and
- a latch circuit configured to latch the redundancy signal and output the redundancy enable signal, in response to the redundancy check pulse signal.

16. The semiconductor device of claim 15, wherein the latch circuit comprises:
- a first latch configured to latch the redundancy signal in response to a first pulse signal of the redundancy check pulse signal, and output the first redundancy enable signal; and
- a second latch configured to latch the redundancy signal in response to a second pulse signal of the redundancy check pulse signal, and output the second redundancy enable signal.

17. The semiconductor device of claim 10, wherein the word line control circuit disables a word line of the upper region when the first redundancy enable signal is activated, and disables a word line of the lower region when the second redundancy enable signal is activated.

18. The semiconductor device of claim 10, wherein the word line control circuit disables a word line of the lower region when the second redundancy enable signal is activated, and sequentially refreshes redundancy word lines of the lower region.

* * * * *